United States Patent
Lin et al.

(10) Patent No.: US 6,297,098 B1
(45) Date of Patent: Oct. 2, 2001

(54) TILT-ANGLE ION IMPLANT TO IMPROVE JUNCTION BREAKDOWN IN FLASH MEMORY APPLICATION

(75) Inventors: Chrong-Jung Lin, Hsien-Tien; Hung-Der Su, Kao-Hsiung County; Jong Chen, Taipei; Wen-Ting Chu, Kaoshiung County, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/431,236

(22) Filed: Nov. 1, 1999

(51) Int. Cl.$^7$ ................................. H01L 21/8247
(52) U.S. Cl. ..................... 438/264; 438/302; 438/525
(58) Field of Search ................... 438/257, 264, 438/302, 525, 529

(56) References Cited

U.S. PATENT DOCUMENTS

| | | |
|---|---|---|
| 5,482,881 * | 1/1996 | Chen et al. ..................... 438/302 |
| 5,498,554 | 3/1996 | Mei ................................. 437/34 |
| 5,565,369 | 10/1996 | Ko .................................. 437/30 |
| 5,750,435 | 5/1998 | Pan ................................. 438/525 |
| 5,770,502 | 6/1998 | Lee ................................. 438/264 |
| 5,793,090 | 8/1998 | Gardner et al. ................. 257/408 |
| 5,851,869 | 12/1998 | Urayama ......................... 438/238 |
| 5,891,774 * | 4/1999 | Ueda et al. ..................... 438/302 |

* cited by examiner

Primary Examiner—Chandra Chaudhari
(74) Attorney, Agent, or Firm—George O. Saile; Stephen B. Ackerman; Sergin Oktay

(57) ABSTRACT

A method is disclosed for forming LDDs (Lightly Doped Drains) in high voltage devices employed in non-volatile memories and DDDs (Doubly Doped Drains) in flash memory applications. The high voltage device is formed by using two successive ion implantations at a tilted angle which provides an improved gradation of doped profile near the junction and the attendant improvement in junction breakdown at higher voltages. The doubly doped drain in a stacked flash memory cell is also formed by two implantations, but at an optimum tilt-angle, where the first implantation is lightly doped, and the second, heavily doped. The resulting DDD provides faster program speed, reduced program current, increase read current and reduced drain disturb in the flash memory cell.

14 Claims, 7 Drawing Sheets

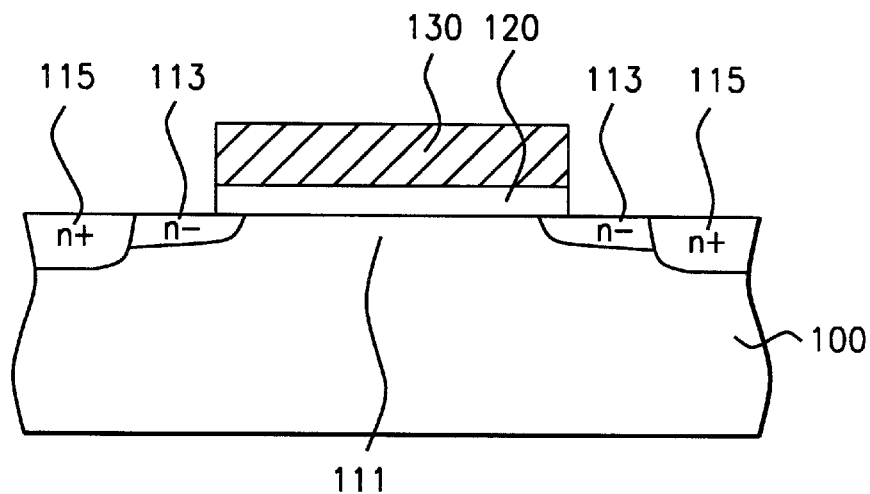
*FIG. 1a - Prior Art*
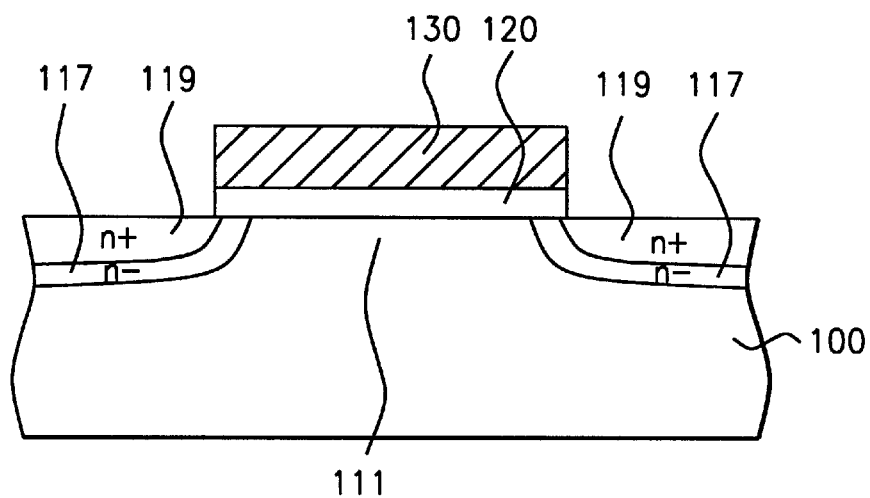
*FIG. 1b - Prior Art*

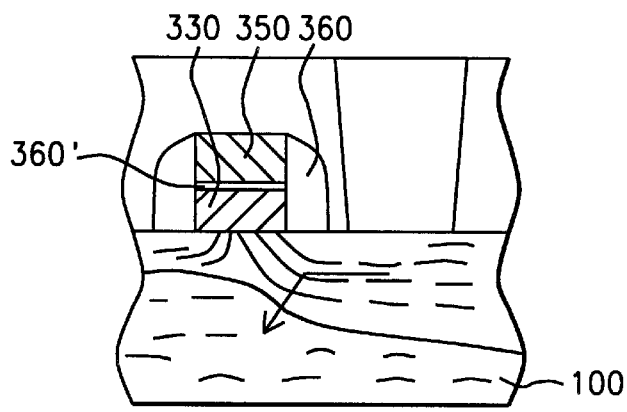
FIG. 3d
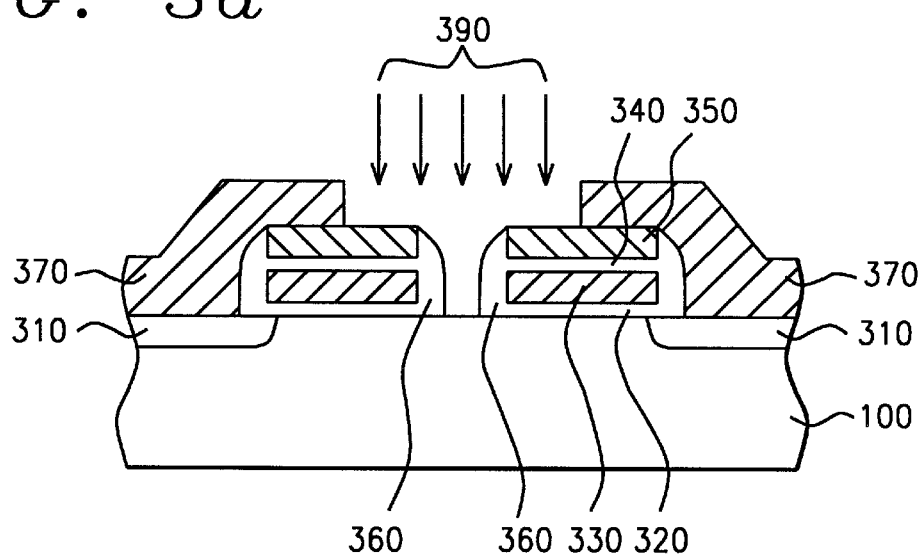
FIG. 3e – Prior Art
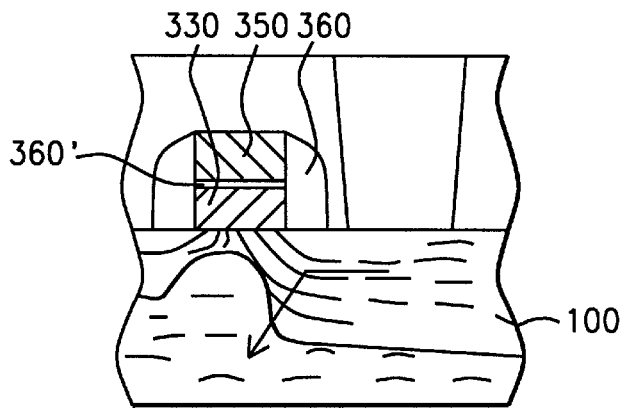
FIG. 3f – Prior Art

TILT-ANGLE ION IMPLANT TO IMPROVE JUNCTION BREAKDOWN IN FLASH MEMORY APPLICATION

BACKGROUND OF THE INVENTION (1) Field of the Invention

The present invention relates to the manufacture of very large (VLSI) and ultra large scale integrated (ULSI) circuits, and more particularly to a tilt-angle implant method of forming LDDs (Lightly Doped Drains) in high voltage devices employed in non-volatile memories, as well as to an optimum implant angle method of forming DDDs (Doubly Doped Drains) in flash memory applications.

(2) Description of the Related Art

As the device dimensions in very large (VLSI) and ultra large scale integrated (ULSI) circuits are reduced and the supply voltage remains constant, the lateral electric filed generated in MOS (Metal-Oxide-Semiconductor) devices increases. The maximum electric field, $E_M$, in a MOSFET (Field Effect Transistor) occurs near the drain during saturated operation. As is known in the art, $E_M$ increases as device dimensions shrink including the length of the channel, $L_{eff}$, as well as due to the thinner gate oxides and shallower junctions. If the electric field becomes strong enough, it can give rise to the so-called hot-carrier effects in MOS FETs (Field-Effect Transistor) devices. If the carriers are electrons such as in n-channel NMOS FETs rather than holes such as in p-channel PMOS FETs, the effects of hot-electrons become even more severe than hot-hole effects because of the higher electron mobility.

Electrons in high electric fields become "hot" electrons because they gain kinetic energy. Such hot electrons—which become hot near the drain edge of the channels because that is where the high electric filed exists—can cause several effects in the device. First, electrons that acquire high energy of more than 1.5 KeV can lose it through, what is known as, impact ionization, which generates electron-hole pairs. The total number of electron-hole pairs generated by impact ionization is exponentially dependent on the reciprocal of the electric field. In some cases, this electron-hole pair generation can lead to a form of avalanche breakdown, as is also known in the art. Second, the hot holes and electrons can overcome the potential energy barrier between the silicon and the $SiO_2$, thereby causing hot carriers to become injected into the gate oxide. This in turn leads to long-term device degradation and reduced reliability. It is disclosed in this invention a method of reducing the high electric field at the drain region of a MOSFET through a more gradual, or graded, change in the doping concentration at the drain/channel interface implemented by using ion implantation at certain tilt-angles which can provide optimum conditions for well-behaving junctions.

In prior art, different methods have been proposed to provide the graded semiconductor substrate junction for control of the hot-carrier-effect (HCE) within MOSFET devices. These include: (1) the Lightly Doped Drain (LDD) method whereby two partially overlapping ion implants at substantially different ion implant doses are provided into a semiconductor substrate to yield a lightly doped semiconductor substrate region beneath the gate electrode edges and a heavily doped semiconductor substrate region forming the remote source/drain electrodes, and (2) the Doubly Doped Drain (DDD) method whereby two different dopant ions of substantially different diffusivity are implanted into the same region of the semiconductor substrate and thermally annealed to provide the graded junction which includes the highly doped source/drain electrodes and the lightly doped semiconductor substrate region beneath the gate electrode edges. These prior art methods are shown in FIGS. 1a and 1b as follows, where substrate (100) has a channel region (111) adjacent to source/drain regions (113) overlapping the overlying edges of gate oxide (120) separating gate (130) from the substrate:

In FIG. 1a, substrate (100) is implanted with a heavy implant to create regions (115), and an implant with lighter doping concentration to form regions (113), thus forming an LDD. The two implants are performed using two different masks, where one of them is the gate (130) itself. A smaller electric field results at the channel (111)/ drain (113) interface than would exist in a device in which a single heavy implant were to be performed, due to a reduction in the difference in dopant concentrations between the channel and the drain regions adjacent to it.

In FIG. 1b, a DDD is formed to alleviate the double problem of drain/channel junction breakdown and hot electron injection into gate oxide (120). In this method, two implants are performed using the same mask, namely, gate itself (130) as the mask, which result in regions (117) and (119) shown in FIG. 1b. The first implant comprises phosphorous followed by a second implant comprising arsenic. The greater diffusivity of phosphorus causes it to diffuse laterally during the implant anneal, to form region (117) which has a lighter resultant dopant concentration than adjacent region (119) formed by the arsenic implant.

As described by Ko in U.S. Pat. No. 5,565,369, a disadvantage of the doubly doped drain approach is an increase in source/drain junction capacitance. This leads to an increase in the RC constant and an undesirably higher propagation delay, which results in a slower performance of the circuits formed with these devices. In order to solve these problems, along with the hot electron problem, Ko provides a silicon substrate with field isolation regions and a gate structure. A layer of photoresist is formed on the field isolation region, the silicon substrate, and the gate structure. The photoresist is patterned to expose the silicon substrate and the gate structure, but covers an area of the silicon substrate that is offset from the field isolation regions. A first ion implant is performed in a vertical direction in exposed regions of the silicon substrate, with suitable dopant having a high doping concentration. The photoresist is removed. A second ion implant is performed in a vertical direction in the silicon substrate, with suitable dopant with higher doping concentration than the first ion implant, in regions between the field isolation regions and the gate structure. The substrate is heated to drive in both the dopants to form the DDD structure.

Similarly, Gardner, et al., of U.S. Pat. No. 5,793,090 show an integrated circuit having multiple LDD and/or source/drain implant steps to enhance circuit performance. The first implant of the multiple implants serves to condition the implant area so that the second and subsequent implants are accurately placed with relatively high concentrations closely below the substrate surface. The resulting junction is one which has relatively high drive strength, low contact resistivity, low source-to-drain parasitic resistance, and relatively low junction capacitance.

Urayama, on the other hand, proposes in U.S. Pat. No. 5,851,869, the use of a DDD structure in the manufacture of a semiconductor device having low contact resistance. His device is capable of stably operating even at a low voltage through having in a substrate an oozed diffusion region, a low resistivity region, and a DDD structure transistor formed on another region of the surface of the substrate, wherein a length of a portion of the low resistivity region overlapping a conductive film is substantially the same as a length of a portion of the deep source and drain regions of the DDD structure overlapping the gate electrode. Mei of U.S. Pat. No. 5,498,554 also shows a method of making an integrated circuit containing low voltage PMOS and/or NMOS devices as well as high voltage PMOS and/or NMOS devices. Low and high values are obtained by selecting impurity concentration levels appropriate for different regions in a substrate.

Lee of U.S. Pat. No. 5,770,502 discloses a method of forming a modified DDD junction structure which is formed on stack gate structure side on which a floating gate and a control gate are laminated and a non-DDD structure is formed on split gate side, by forming a first impurity region through a tilt-angle implanting of impurity ions at a high level of energy and the forming a second impurity region through a tilt-angle implanting of impurity ions at a lower level of energy using a spacer.

Pan, in U.S. Pat. No. 5,750,435, teaches a method for minimizing the hot carrier effect in N-MOSFET devices by implanting into the gate oxide regions beneath the gate electrode edges a dose of a hardening ion. The hardening ion is either nitrogen ion or fluorine ion. The hardening ion is implanted at an angle non-orthogonal to the plane of the semiconductor substrate through means of a large tilt-angle ion implant process.

It is disclosed later in the embodiments of the present invention a different method of forming LDDs and DDDs in flash memory applications through an optimal implant angle. This method provides a good doping concentration contour and profile with the attendant advantage of having improved junction breakdown characteristics. Other advantages include the increased program speed, reduced program current, increased read current and reduced drain disturb of the flash memory cell.

SUMMARY OF THE INVENTION

It is therefore an object of this invention to provide a tilt-angle implant method of forming LDDs (Lightly Doped Drains) in high voltage devices employed in non-volatile memories.

It is another object of the present invention to provide a method of improving the junction breakdown characteristics of high voltage devices.

It is still another object of this invention to provide an optimum implant angle method of forming DDDs (Doubly Doped Drains) in flash memory applications.

It is yet another object of this invention to provide a method of providing an improved dopant profile of graded drain contouring with the attendant increased program speed, reduced program current, increased read current and reduced drain disturb in a flash memory cell.

The objects of a first embodiment are accomplished by providing a silicon substrate having a plurality of active and field regions defined; forming a thick gate oxide layer over said substrate; forming a gate electrode over said thick gate oxide layer; performing a first ion implantation with a tilt-angle; forming oxide spacers on sidewalls of said gate electrode; and performing a second ion implantation with no tilt-angle.

The objects of a second embodiment are accomplished by providing a silicon substrate having a plurality of active and field regions defined; forming a gate oxide layer over said substrate; forming a floating gate over said thick gate oxide layer; forming an inter-gate oxide layer over said floating gate; forming a stacked control gate over said inter-gate oxide; forming oxide spacers on sidewalls of said stacked gate; performing a first lightly doped implantation with an optimum tilt-angle; and performing a second heavily doped implantation with an optimum tilt-angle.

The objects of the present invention are further accomplished by providing a stacked gate flash memory cell having a doubly diffused drain (DDD) comprising a junction having a lightly doped profile; and a surface region having a heavily doped profile.

BRIEF DESCRIPTION OF THE DRAWINGS

FIG. 1a is a cross-sectional view of a portion of a semiconductor substrate showing the forming of a Lightly Doped Drain (LDD) of a stacked gate flash memory cell of prior art.

FIG. 1b is a cross-sectional view of a portion of a semiconductor substrate showing the forming of a Doubly Doped, or, Diffused, Drain (DDD) of a stacked gate f lash memory cell of prior art.

FIG. 3d is a cross-sectional view of a portion of a semiconductor substrate showing the gradation of the doped profile of the DDD of this invention.

FIG. 3e is a cross-sectional view of a portion of a semiconductor substrate showing the vertical implantation of a stacked gate memory cell, according to prior art.

FIG. 3f is a cross-sectional view of a portion of a semiconductor substrate showing the gradation of the doped profile of the DDD of prior art.

DESCRIPTION OF THE PREFERRED EMBODIMENTS

Figure 2A:
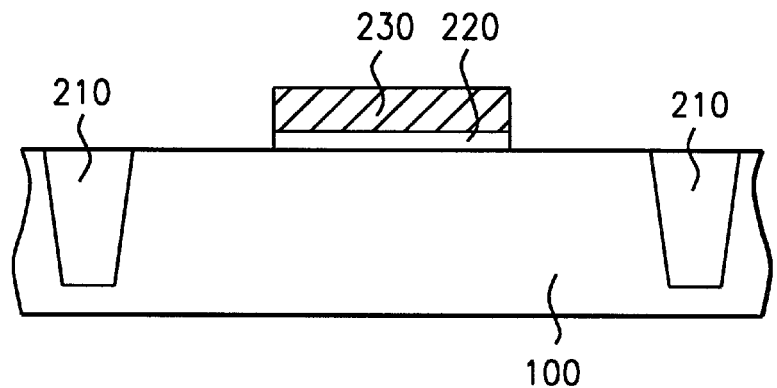
FIG. 2a is a cross-sectional view of a portion of a semiconductor substrate showing the forming of a gate electrode over an active region delineated by trench isolation regions, according to the present invention.

Referring now to the drawings, in particular to FIGS. 2a–2e, and 3a–3i there are shown schematically steps of performing tilt-angle ion implantations in forming Lightly Doped (LDDs) and Doubly Doped Drains (DDDs). More specifically, FIGS. 2a–2e show steps of a first embodiment where a tilt-angle ion implant is used to form a high voltage device employed in non-volatile memories. FIGS. 3a–3i show steps of a second embodiment where an optimum tilt-angle ion implant is used to form a stacked gate flash memory cell.

In FIG. 2a, substrate (100), preferably silicon, is provided within and upon whose surface is formed isolation regions (210) which define the active region of the semiconductor substrate (100). Although the present invention may be practiced upon a semiconductor substrate of various dopant concentrations, either dopant polarity and various crystallographic orientation, the present invention is typically practiced upon a P- or N-semiconductor substrate having a (100) crystallographic orientation.

Isolation regions may in general be formed upon a semiconductor substrate through methods including but not limited to methods whereby portions of the semiconductor substrate exposed through a suitable mask are thermally oxidized to from isolation regions and methods whereby a suitable insulating material is formed upon the surface of the semiconductor substrate and patterned to form isolation regions. For the first embodiment of the present invention, the isolation regions (210) are preferably formed through a non-LOCOS (Local oxidation of Silicon) method, where trenches are formed in the substrate and then filled with an isolation oxide. It is preferred that trench (210) has a depth between about 3000 to 5000 Å.

Also shown in FIG. 2a is gate oxide layer (220) formed upon the active region of substrate (100), and gate electrode (230) formed upon the gate oxide layer. Methods through which both gate oxide layers and gate electrodes may be formed are conventional to the art. Gate oxides may be formed trough methods including but not limited to methods where by the surface of the active region of a semiconductor substrate is oxidized to form a gate oxide, and methods whereby a layer of gate oxide material is deposited upon the surface of the active region of a semiconductor substrate. For the first embodiment of the present invention, preferably a thick gate oxide layer, namely, layer (210) of a thickness between about 3000 to 5000 Å, is formed by chemical vapor deposition at a temperature between about 450 to 600° C.

Gate electrodes are typically formed upon gate oxides via patterning through methods as are conventional in the art of a blanket layer of gate electrode material. Typical gate electrode materials include but are not limited to metals, metal alloys, high doped polysilicon and polycides (polysilicon/metal silicide stacks). For the first embodiment of the present invention, gate electrode (230) is formed upon the surface of gate oxide layer (210) preferably by depositing a layer of polysilicon to a thickness between about 1000 to 2000 Å at a temperature range between about 570 to 625° C., and patterning the polysilicon layer. Patterning is accomplished with an etch recipe comprising $Cl_2$ and HBr.

Using gate electrode (230) as a mask, ion implantation is next performed in the active region of substrate (100) delineated by isolation regions (210) shown in FIG. 2a. As a main feature and key aspect of the present embodiment, a first ion implantation is performed at a specific tilt-angle prior to a second no-tilt-angle implantation such that the two together yield the highest drain $V_{db}$ voltage. The following Table shows the highest voltage values obtained with tilt-angles that were included in the experiments conducted with NMOS and PMOS devices.

TABLE I

| MOS type → Tilt-angle ↓ | $V_{bd}$ (V) NMOS (N-type LDD) | PMOS (P-type LDD) |
|---|---|---|
| 0 | 16.5 | −13.8 |
| 15 | 16.5 | −14.1 |
| 30 | 16.9 | −14.9 |
| 45 | 17.5 | −15.6 |

It is preferred therefore, that the implant tilt-angle in performing the first ion implantation is between about 40 to 45 degrees.

Figure 2B:
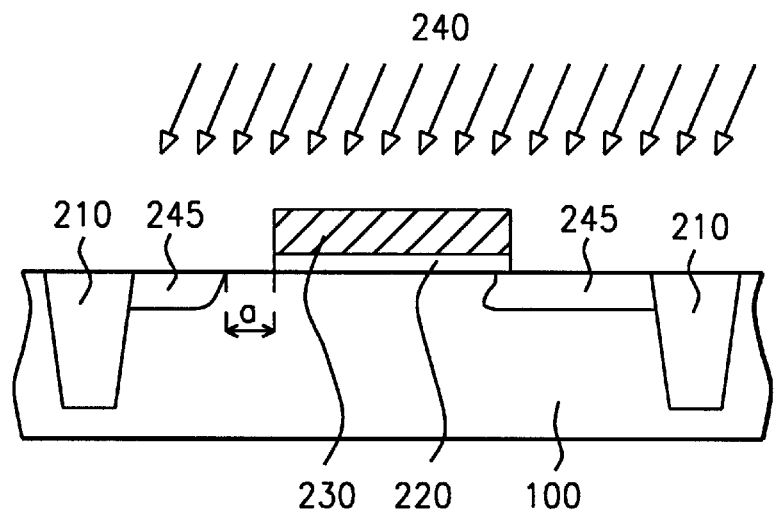
FIG. 2b is a cross-sectional view of a portion of a semiconductor substrate showing the tilt-angle implant of the substrate of FIG. 2a from the right side, according to the present invention.
Figure 2C:
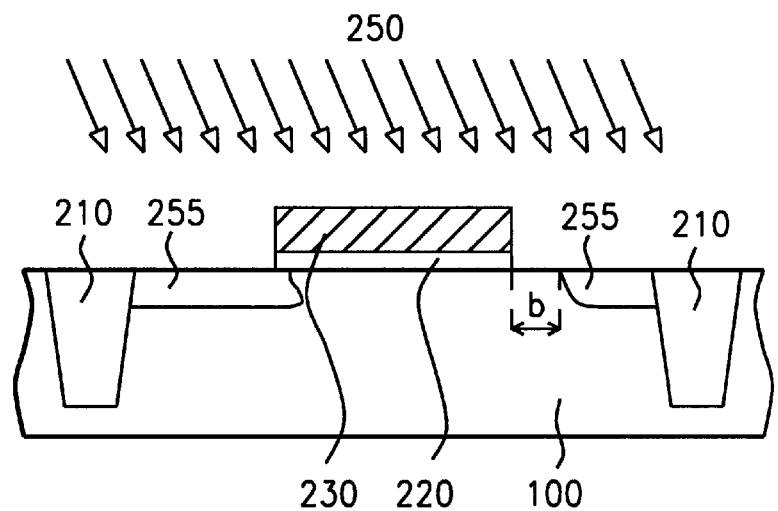
FIG. 2c is a cross-sectional view of a portion of a semiconductor substrate showing the tilt-angle implant of the substrate of FIG. 2a from the left side, according to the present invention.
Figure 2D:
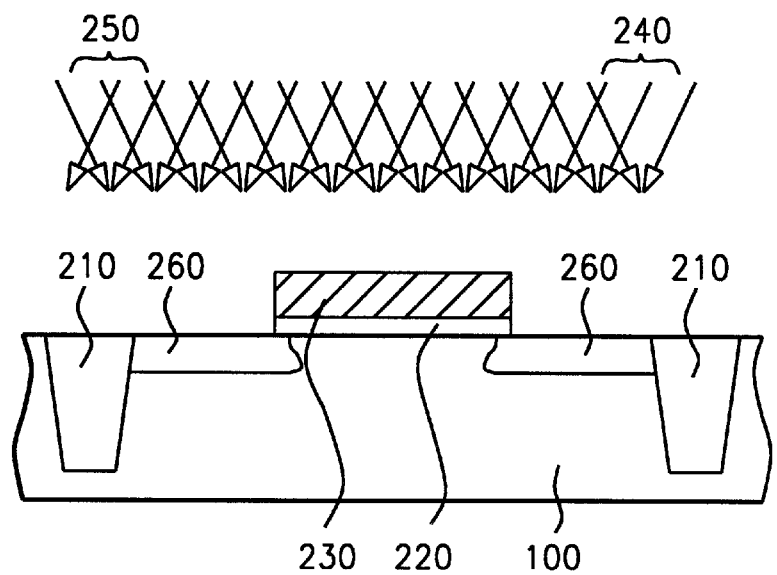
FIG. 2d is a cross-sectional view of a portion of a semiconductor substrate showing the superimposed tilt-angle implant of the substrate of FIG. 2a, according to the present invention.

FIGS. 2b and 2c show the 45° tilt-angle that is employed during the first implantation. However, it will be appreciated by those skilled in the art that, any implant with a tilt-angle will be subject to a shadowing effect by the presence of gate electrode (230). That is, ions (240) implanted at a tilt-angle and arriving from the right with respect to the view shown in FIG. 2b will miss region (a) on the substrate as protected by the left sidewall of electrode (240). Similarly, ions (250) implanted at a tilt-angle from the left with respect to the view shown in FIG. 2c will miss region (b) on the substrate as protected by the right sidewall of electrode (230). Therefore, first implantation at the preferred tilt-angle is performed twice, once from the right and once from the left as shown in FIGS. 2b and 2c, respectively. The two implantations form regions (245) and (255), which when superimposed together form regions (260) shown in FIG. 2d. Alternatively, the first implant can be performed while rotating the substrate at the preferred tilt-angle, resulting in the same regions (260). Further, for the NMOS device, first implantation is performed with phosphorous ions at a dosage level between about $1\times10^{13}$ to $5\times10^{13}$ atoms/cm², and energy level between about 35 to 55 KeV. For the PMOS device, the implantation is performed with boron ions at a dosage level between about $1\times10^{13}$ to $5\times10^3$ atoms/cm², and energy level between about 20 to 35 KeV.

Figure 2E:
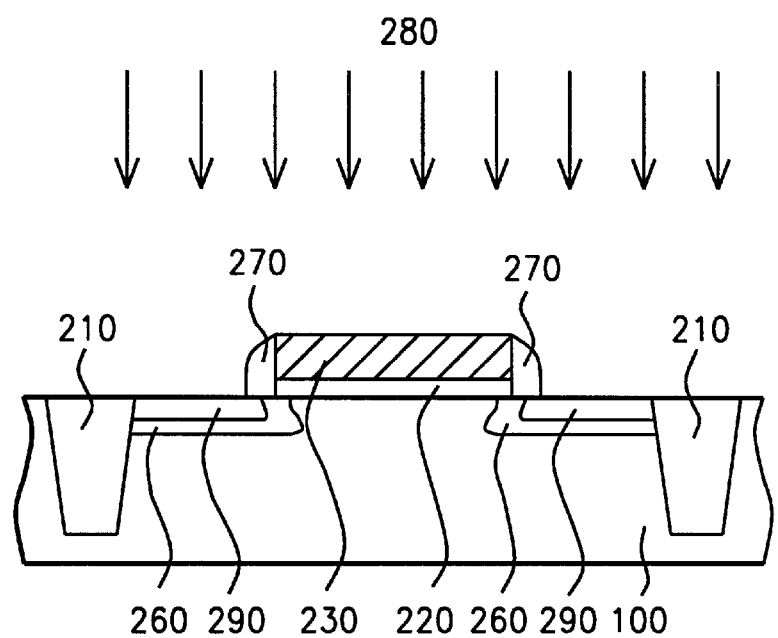
FIG. 2e is a cross-sectional view of a portion of a semiconductor substrate showing the forming of a Lightly Doped Drain (LDD) of the high voltage device of this invention.

A second, and a final implantation is formed with no-tilt-angle, that is, vertically, as shown in FIG. 2e; however, after forming spacers (270). Spacers are formed conventionally by depositing an oxide layer and etching anisotropically. The preferred thickness of the oxide layer is between about 1200 to 1500 Å. Implantation (280) is performed with arsenic (As) ions at a dosage level between about $2\times10^{15}$ to $5\times10^{15}$ atoms/cm² at energy level between about 40 to 60 KeV forming regions (290) shown in FIG. 2e. Regions (260) and (290) so formed are further driven into substrate (100) thermally at a temperature between about 850 to 950° C. such that a graded junction from a lightly doped region (290) at the location of high electric field beneath the gate electrode edges to a heavy doped region (260) is formed. This graded junction then minimizes or eliminates the junction breakdown, thus allowing high voltage operations. It will be appreciated by those skilled in the art that in a non-volatile memory cell, high voltage device is needed in order to obtain faster programming speed.

Figure 3A:
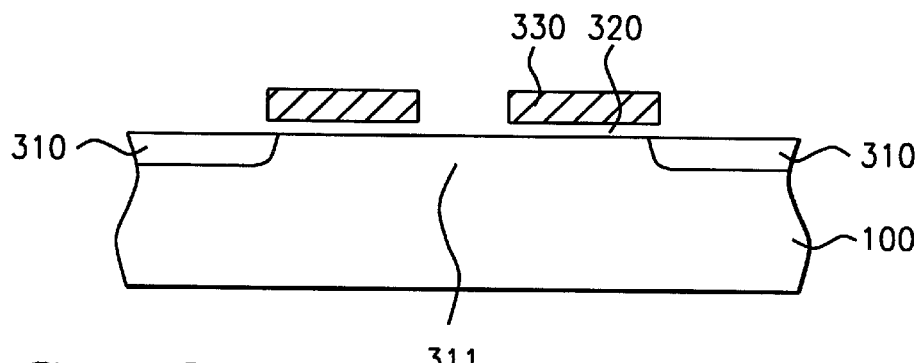
FIG. 3a is a cross-sectional view of a portion of a semiconductor substrate showing the forming of a first gate electrode, according to this invention.

An optimum tilt-angle implant can also be used to advantage in forming stacked gate flash memory cells with improved program speed as disclosed in a second embodiment of the present invention shown in FIGS. 3a–3i. In FIG. 3a, a portion of a silicon substrate (100) is shown with active region (311) defined with regions (310) to serve as a source for the stacked gate flash memory cell of this invention. Gate oxide layer (320) is formed over the active region of substrate (100), preferably by thermally growing the oxide from the underlying silicon at a temperature between about 900 to 950° C., and to a thickness between about 80 to 95 Å.

Figure 3B:
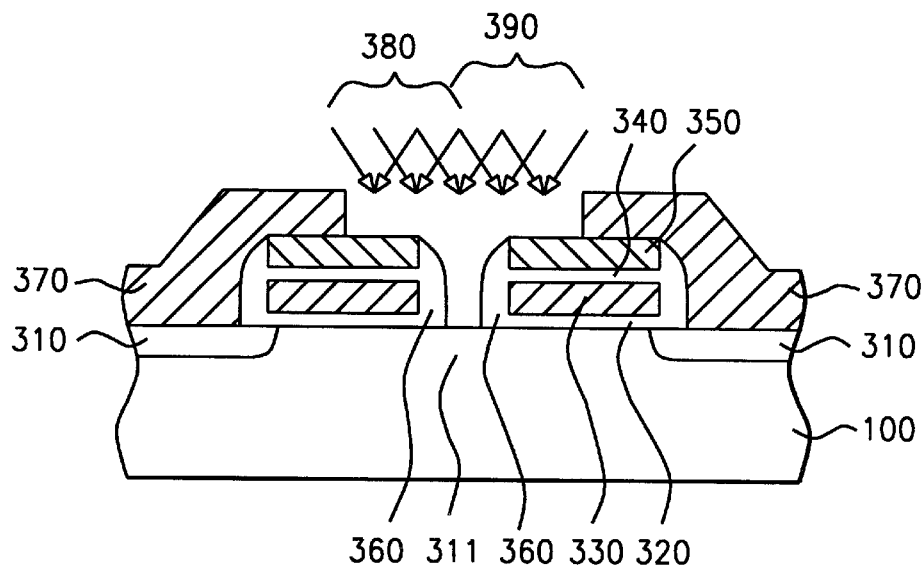
FIG. 3b is a cross-sectional view of a portion of a semiconductor substrate showing the optimum-angle implantation of the stacked gate of this invention.
Figure 3C:
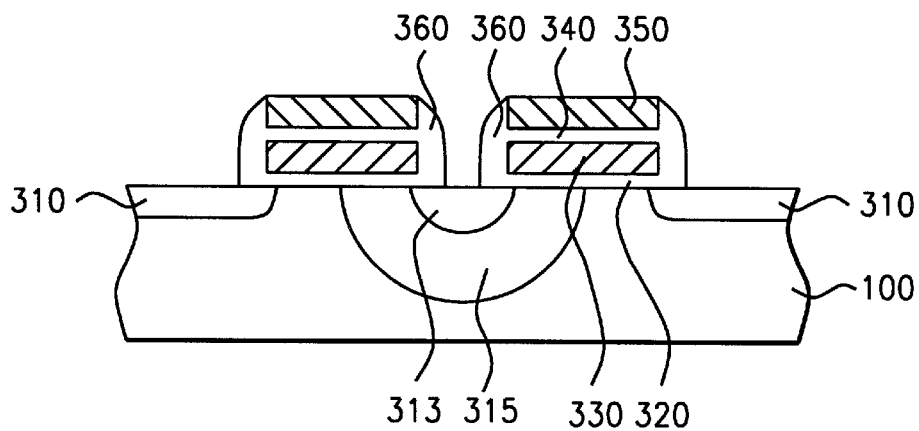
FIG. 3c is a cross-sectional view of a portion of a semiconductor substrate showing the forming of a Doubly Doped Drain (DDD) of the stacked gate flash memory cell of this invention.

Next, a first polysilicon layer is deposited over the gate oxide layer through an LPCVD method employing silane $SiH_4$ as a silicon source material at a temperature range between about 570 to 625° C. The preferred thickness of the first polysilicon layer is between about 1000 to 2000 Å, which is next patterned to form floating gate (330) as shown in FIG. 3a. The patterning is accomplished preferably by etching the first polysilicon layer with a recipe comprising $Cl_2$ and HBr. This is followed by the forming of inter-gate oxide layer (340) as shown in FIG. 3b. Layer (340) is preferably formed thermally at a temperature between about 800 to 900° C., and to a thickness between about 120 to 160 Å. A second polysilicon layer is formed over the inter-gate oxide layer and patterned to form control gate (350) as shown in the same FIG. 3b. It is preferred that the second polysilicon layer has a thickness between about 1500 to 2500 Å. The sidewalls of the stacked gate so formed are next covered by spacers (360) by depositing an oxide layer over the substrate and etching anisotropically. The preferred thickness of the spacer oxide layer is between about 1200 to 1500 Å.

The substrate is then covered by a photoresist layer which is patterned to protect source regions (310) from ion implantation to be performed as shown in FIG. 3b. As a main feature and key aspect of the second embodiment of the present invention, a doubly doped or diffused drain (DDD) is next formed using an optimum tilt-angle implant in region (311) of substrate (100) shown in the same figure. It will be appreciated by workers in the field that conventional DDDs are formed vertically, with no-tilt-angle. In this embodiment, the preferred optimum angle is between about 40 to 50 degrees from the horizontal. Further, the DDD is formed by performing two implants at an optimum tilt-angle. The first implant is accomplished with lightly doped phosphorous ions at a dosage level between about $1\times10^{13}$ to $5\times10^{13}$ atoms/cm$^2$, and energy level between about 35 to 55 KeV. This is followed by a second implant using the same optimum tilt-angle using arsenic ions at a dosage level between about $2\times10^{15}$ to $5\times10^{15}$ atoms/cm$^2$ and energy level between about 40 to 60 KeV. The first and second implants are preferably performed while rotating the substrate at the optimum angle so that the shadowing effect by the sidewalls of the stacked gate is alleviated. Alternatively, the implants can be performed from left and right at the proper optimum tilt-angle as depicted in FIG. 3b.

At the next and final step, the implanted regions are thermally driven for a relatively short time of between about 10 to 20 minutes at a temperature range between about 850 to 950° C. This is to be compared with the conventional diffusion time of between about 30 to 60 minutes with the conventional vertical implantation with no-tilt-angle as shown in FIG. 3e.

The resulting junction profile obtained with the disclosed method is shown in FIG. 3d where the doping gradation is smoother with the junction being established well under the stacked gate in comparison with the pinched and abruptly contoured gradation of the prior art shown in FIG. 3f. Furthermore, it is to be noted that the DDD junction of the present embodiment is lightly doped, and the surface region is heavily doped, which is the inverse of conventional flash memory cells.

Figure 3G:
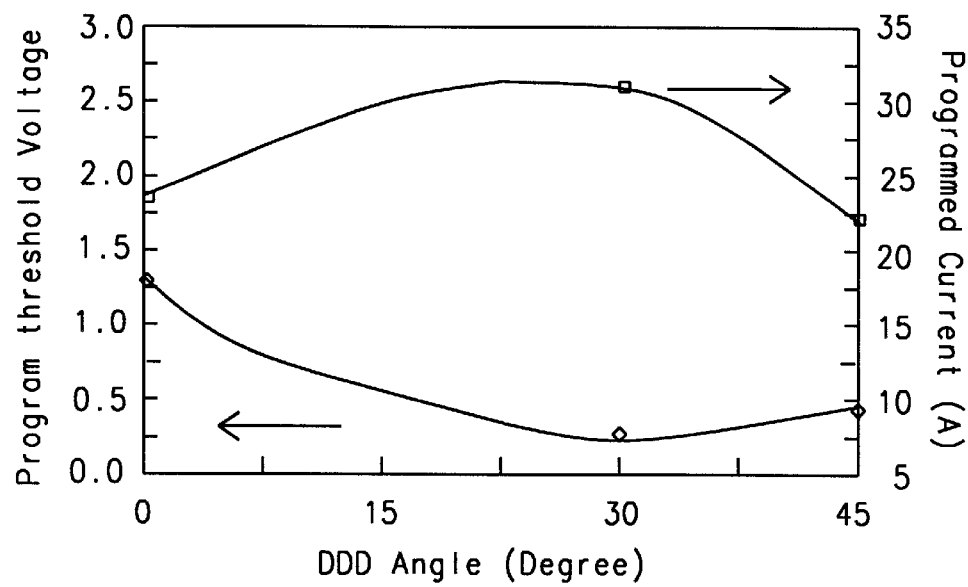
FIG. 3g is a plot of measured Programmed Threshold Voltage (V) and Programmed Current (A) as a function of the optimum-angle implant of the DDD of this invention.
Figure 3H:
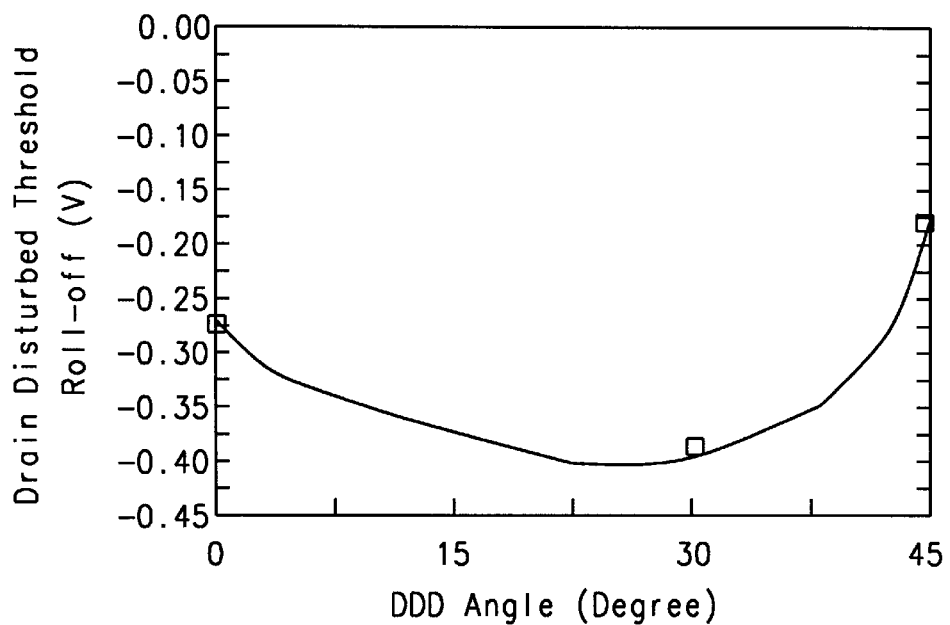
FIG. 3h is a plot of measured Drain disturbed Threshold Roll-Off (V) as a function of the optimum-angle implant of the DDD of this invention.
Figure 3I:
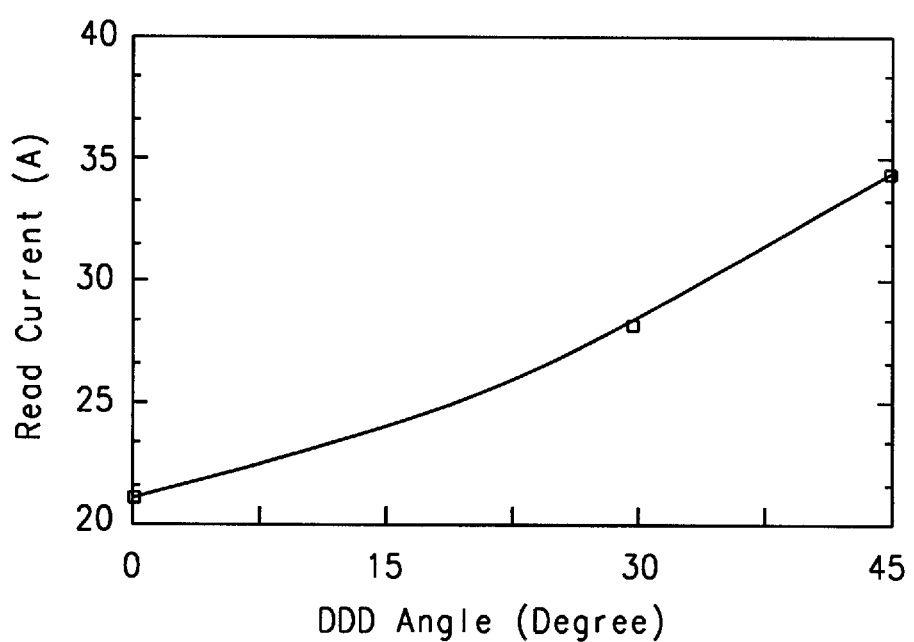
FIG. 3i is a plot of measured Read Current (A) as a function of the optimum-angle implant of the DDD of this invention.

The disclosed method contributes substantially to increased program speed, reduced program current, increased read current and reduced drain disturb of the flash memory cell of the present embodiment, as shown in FIGS. 3g, 3h and 3i. In FIG. 3g, the left vertical axis shows the program threshold voltage (V) while the right vertical axis shows the program current in amperes (A) as a function of the tilt-angle implant. It will be noted that the difference between a fresh cell threshold voltage and disturbed cell threshold voltage is the minimum disturb voltage difference. It will be known to those skilled in the art that the desired voltage difference would be zero. With a 45° angle, the difference is –0.18 V, which is less than that with a 30° angle for which the voltage difference is –0.37 V.

While the invention has been particularly shown and described with reference to the preferred embodiments thereof, it will be understood by those skilled in the art that various changes in form and details may be made without departing from the spirit and scope of the invention.

What is claimed is:

1. An optimum implant angle method of forming a DDD (Doubly Doped Drain) in a stacked flash memory cell comprising the steps of:

providing a silicon substrate having a plurality of active and field regions defined;

forming a gate oxide layer over said substrate;

forming a floating gate over said thick gate oxide layer;

forming an inter-gate oxide layer over said floating gate;

forming a stacked control gate over said inter-gate oxide;

forming oxide spacers on sidewalls of said stacked gate;

performing a first lightly doped implantation with an optimum tilt-angle between about 40 to 50 degrees once from the right and once from the left with respect to the sidewalls of said stacked gate; and then performing a second heavily doped implantation with said optimum tilt-angle once from the right and once from the left with respect to the sidewalls of said stacked gate.

2. The method of claim 1, wherein said gate oxide layer has a thickness between about 80 to 95 Å.

3. The method of claim 1, wherein said forming said floating gate is accomplished by depositing a first polysilicon layer to a thickness between about 1000 to 2000 Å, and then etching said first polysilicon layer.

4. The method of claim 1, wherein said forming said inter-gate oxide layer over said floating gate is accomplished by growing an oxide layer at temperature between about 570 to 625° C.

5. The method of claim 1, wherein said inter-gate oxide layer has a thickness between about 120 to 160 Å.

6. The method of claim 1, wherein said forming said stacked control gate is accomplished by depositing a second polysilicon layer to a thickness between about 1500 to 2000 Å, and then etching said second polysilicon layer.

7. The method of claim 1, wherein said forming said oxide spacers on sidewalls of said stacked gate is accomplished by depositing an oxide layer to a thickness between about 1200 to 1500 Å, and then anisotropically etching said oxide layer.

8. The method of claim 1, wherein said performing said first lightly doped implantation is accomplished with phosphorous ions at a dosage level between about $1\times10^{13}$ to $5\times10^{13}$ atoms/cm$^2$, and at energy level between about 35 to 55 KeV.

9. The method of claim 1, wherein said performing said second lightly doped implantation is accomplished with arsenic ions at a dosage level between about $2\times10^{15}$ to $5\times10^{15}$ atoms/cm$^2$, and at energy level between about 40 to 60 KeV.

10. An optimum implant angle method of forming a DDD (Doubly Doped Drain) in a flash memory cell comprising the steps of:

providing a substrate having active and passive regions defined;

forming a plurality of gates over said substrate;

performing a first lightly doped implantation with an optimum tilt-angle to form a junction of said DDD in said flash memory cell, wherein said first lightly doped implantation is performed twice, once from the right and once from the left with an optimum tilt-angle between about 40 to 50 degrees with respect to the sidewalls of said flash memory cell; then performing a second heavily doped implantation with said optimum tilt-angle to form a surface region of said DDD in said flash memory cell, wherein said second heavily doped implantation is performed twice, once from the right and once from the left with said optimum tilt-angle with respect to the sidewalls of said flash memory cell; or, alternatively rotating said substrate at said optimum tilt-angle while performing said first lightly doped implantation, and then said second heavily implantation; and performing a drive-in diffusion of said doubly doped drain, DDD.

11. The method of claim 10, wherein said plurality of gates are floating gate and control gate of said flash memory cell.

12. The method of claim 10, wherein said performing said first lightly doped implantation is accomplished with phosphorous ions at a dosage level between about $1\times10^{13}$ to $5\times10^{13}$ atoms/cm$^2$, and at energy level between about 35 to 55 KeV.

13. The method of claim 10, wherein said performing said second heavily doped implantation is accomplished with arsenic ions at a dosage level between about $2\times10^{15}$ to $5\times10^{15}$ atoms/cm$^2$ at energy level between about 40 to 60 KeV.

14. The method of claim 10, wherein said performing said drive-in diffusion of said DDD is accomplished at a temperature between about 850 to 950° C.

* * * * *